(12) United States Patent
Gloeckler et al.

(10) Patent No.: US 8,431,427 B2
(45) Date of Patent: Apr. 30, 2013

(54) PHOTOVOLTAIC MODULE MANUFACTURE

(75) Inventors: Markus Gloeckler, Perrysburg, OH (US); Imran Khan, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 98 days.

(21) Appl. No.: 13/035,594

(22) Filed: Feb. 25, 2011

(65) Prior Publication Data

US 2011/0237021 A1  Sep. 29, 2011

Related U.S. Application Data

(60) Provisional application No. 61/309,064, filed on Mar. 1, 2010.

(51) Int. Cl.
*H01L 21/00* (2006.01)

(52) U.S. Cl.
USPC .................. 438/64; 438/88; 438/795

(58) Field of Classification Search .......... None
See application file for complete search history.

(56) References Cited

U.S. PATENT DOCUMENTS

| | | | |
|---|---|---|---|
| 3,436,275 A * | 4/1969 | Tsao et al. | 438/88 |
| 6,288,325 B1 | 9/2001 | Jansen et al. | |
| 7,163,608 B2 | 1/2007 | Stanbery | |
| 2004/0115377 A1 | 6/2004 | Wei et al. | |
| 2006/0286785 A1 | 12/2006 | Rogers et al. | |
| 2009/0087219 A1 | 4/2009 | Aoshima et al. | |

OTHER PUBLICATIONS

Nowlan et al., "Post-Lamination Manufacturing Process Automation for Photovoltaic Modules", Final Subcontract Report, National Renewable Energy Laboratory, Nov. 2002, retrieved Apr. 9, 2011. Retrieved from http://www.nrel.gov/docs/fy03osti/32943.pdf>.
Vijh, A, "Triple Junction Amorphous Silicon based Flexible Photovoltaic Submodules on Polymide Substrates", The University of Toledo, Jul. 2005, retrieved on Apr. 10, 2001. Retrieved from http://etd.ohiolink.edu/send-pdf.cgi/Vijh%20Aarohi.pdf?toledo1122656006>.
International Preliminary Report on Patentability issued in corresponding International Application No. PCT/US2011/026136 on Sep. 13, 2012.

* cited by examiner

*Primary Examiner* — Scott B Geyer
(74) *Attorney, Agent, or Firm* — Dickstein Shapiro LLP

(57) ABSTRACT

A method for manufacturing a photovoltaic module including a laminating step.

17 Claims, 6 Drawing Sheets

US 8,431,427 B2

PHOTOVOLTAIC MODULE MANUFACTURE

CLAIM OF PRIORITY

This application claims priority to U.S. Provisional Patent Application No. 61/309,064, filed on Mar. 1, 2010, which is incorporated by reference in its entirety.

TECHNICAL FIELD

The present invention relates to photovoltaic modules and methods of production.

BACKGROUND

Photovoltaic devices can include transparent thin films that are also conductors of electrical charge. Photovoltaic devices functionality can be based on the formation of a region high in electrons referred to as the n-type and a region high in holes concentration referred to as the p-type in intimate contact. Past photovoltaic devices can be reversibly or irreversibly affected by exposure to light during and after manufacture.

DETAILED DESCRIPTION

Figure 1:
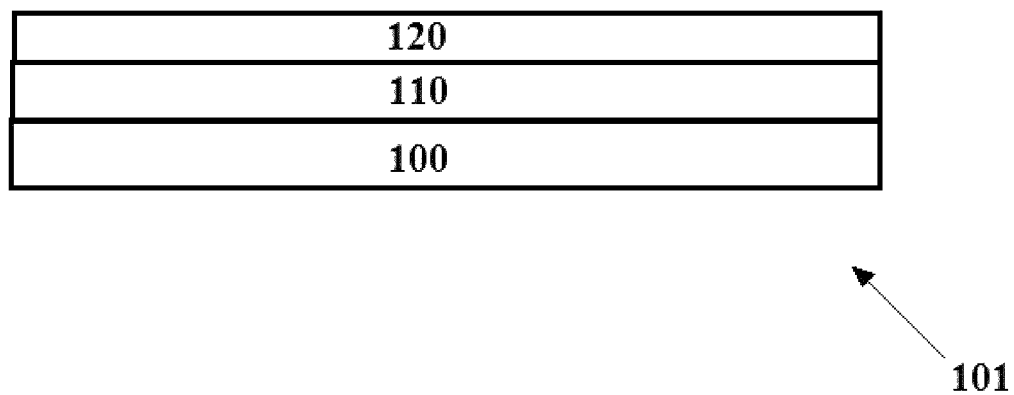
FIG. 1 is a schematic of a photovoltaic module.

Photovoltaic devices can include multiple layers formed on a substrate (or superstrate). For example, a photovoltaic device can include a barrier layer, a transparent conductive oxide (TCO) layer, a buffer layer, a semiconductor window layer, and a semiconductor absorber layer, formed in a stack on a substrate. Each layer may in turn include more than one layer or film. For example, the semiconductor window layer and semiconductor absorber layer together can be considered a semiconductor layer. The semiconductor layer can include a first film created (for example, formed or deposited) on the TCO layer and a second film created on the first film. Additionally, each layer can cover all or a portion of the device and/or all or a portion of the layer or substrate underlying the layer. For example, a "layer" can mean any amount of any material that contacts all or a portion of a surface.

Thin film solar cells such as those including copper-indium-gallium-selenium (CIGS), cadmium telluride (CdTe), and amorphous silicon (a-Si) often show changes in their current-voltage behavior after light exposures of extended periods of time (>0.5 hr-days). Some structures such as CIGS solar cells show transient degradation that is fully reversible. Some structures such as a-Si solar cells show degradation that is not reversible, often referred to as stabilization. In CdTe solar cells, both phenomena have been observed where efficiency increases and stabilizes or decreases after brief exposure to light. Currently, such reversible or irreversible changes create difficulties for the proper assessment of the relevant device performance as the device at the end of the manufacturing process may be in a state that is non-representative of the expected field performance. A manufacture process and the related system are developed as an alternative to using light exposure to invoke these changes in the device.

Thin film solar cells such as CIGS, CdTe, and a-Si often show changes in their current-voltage behavior after light exposures of extended periods of time (>0.5 hr-days). An increased temperature can accelerate these changes. Additionally, the application of an external electrical power supply that creates a bias in the photovoltaic device can be sufficient to induce these changes. The acceleration by temperature of the process by increasing the temperature during light exposure is tested. The same effect can be achieved under a constant current load while the device is held at an elevated temperature. Increasing the temperature while under a constant electrical current load can accelerate the change. These changes enable the process to become manufacturable. In some embodiments, this process can be combined with a lamination process, which has similar cycle times and can provide the heating required to invoke the necessary changes.

In a lamination process, thin film photovoltaic devices can be encapsulated within the module by materials designed to seal and hold the module together for many years and under a variety of conditions. The encapsulation material can help retain heavy metals present within the module by forming low solubility compounds that immobilize, chelate, adsorb, and/or fixate the cadmium and/or other heavy metals within the structure of the module to assist with handling and disposal.

In one aspect, a method for manufacturing a photovoltaic module can include heating a photovoltaic module to a temperature above 100 degrees C. and applying an electrical bias to the heated photovoltaic module. The step of heating the photovoltaic module occurs during a lamination process can include placing a photovoltaic module interlayer in contact with a photovoltaic module substrate before heating the photovoltaic module and pressing the interlayer and the substrate together. Applying an electrical bias to the photovoltaic module can take place after heating the photovoltaic module. Applying an electrical bias to the photovoltaic module can take place during heating of the photovoltaic module. Applying an electrical bias to the photovoltaic module can take place during the lamination process. Applying an electrical bias to the photovoltaic module can take place after the lamination process.

Applying an electrical bias can have a duration longer than that of heating the photovoltaic module. Applying an electrical bias can have a duration shorter than that of heating the photovoltaic module. Applying an electrical bias can have a duration substantially the same as that of heating the photovoltaic module. Applying the electrical bias can include supplying constant current with an upper voltage limit. Applying the electrical bias can include supplying constant voltage with an upper current limit. The electrical bias can generate a current that is in the range of 0.3-5 times of the short circuit current of the photovoltaic device.

Heating the photovoltaic module can include heating the photovoltaic module to a temperature in the range of 100 to 220 degree C. Heating the photovoltaic module can include heating the photovoltaic module to a temperature in the range of 120 to 180 degree C. Heating the photovoltaic module can include heating the photovoltaic module to a temperature in the range of 120 to 160 degree C. The lamination process can have a duration of 1 to 60 minutes. The lamination process can have a duration of 1 to 30 minutes. The lamination process can have a duration of 1 to 20 minutes. The lamination process can have a duration of 5 to 20 minutes.

The step of applying the electrical bias can include applying the electrical bias for 1 to 60 minutes. The step of applying the electrical bias can include applying the electrical bias for 1 to 20 minutes. The step of applying the electrical bias can include applying the electrical bias for 5 to 20 minutes.

In one aspect, a system for manufacturing a photovoltaic module can include a conditioning station including a heater configured to heat a photovoltaic module to a temperature greater than 100 degrees C. and a power source configured to apply an electrical bias to the photovoltaic module. The system can include a laminator configured to press a photovoltaic module interlayer and photovoltaic module substrate together after a photovoltaic module is heated. The system can include a conveyor to transport a photovoltaic module from the laminator.

The laminator can include the heater configured to heat a photovoltaic module to a temperature greater than 100 degrees C. and a press configured to force a photovoltaic module interlayer and a photovoltaic substrate together. The power source can be configured to apply the electrical bias to a photovoltaic module subsequent to the heater heating the photovoltaic module. The power source can be configured to apply the electrical bias to a photovoltaic device simultaneous to the heater heating the photovoltaic module. The power source can be set at a constant current with an upper voltage limit. The power source can be set at a constant voltage with an upper current limit.

The electrical bias can generate a current that is in the range of 0.3-5 times of the short circuit current of the photovoltaic device. The heater can be configured to heat a photovoltaic module to a temperature in the range of 120 to 180 degree C. The laminator can be configured to laminate a photovoltaic module for between 1 to 20 minutes. The system can include a photovoltaic module including a thin film photovoltaic device. The system can include a photovoltaic module including a cadmium telluride photovoltaic device. The system can include a photovoltaic module including a CIGS photovoltaic device. The system can include a photovoltaic module including an amorphous silicon photovoltaic device.

Referring to FIG. 1, photovoltaic module 101 can include front substrate 100. Front substrate 100 can include any suitable material, including glass, for example, soda-lime glass. One or more layers 110 can be deposited adjacent to front substrate 100, which can serve as a first substrate, on top of which various layers may be added. Layer(s) 110 can include one or more device layers. For example, layer(s) 110 can include one or more thin film photovoltaic device layers. Photovoltaic device layers can further include a transparent conductive oxide layer adjacent to substrate 100, a semiconductor window layer adjacent to the transparent conductive oxide layer, and a semiconductor absorber layer adjacent to the semiconductor window layer.

In some embodiments, layer(s) 110 can include cadmium telluride (CdTe) photovoltaic device layers. CdTe photovoltaic device layers can further include a transparent conductive oxide layer, a semiconductor window layer, and a CdTe absorber layer. In some embodiments, layer(s) 110 can include copper indium gallium selenide (CIGS) photovoltaic device layers. CIGS photovoltaic device layers can further include a transparent conductive oxide layer and a CIGS absorber layer. Layer(s) 110 can include any suitable photovoltaic absorber material, including, for example, silicon, such as amorphous silicon.

Layer (s) 110 can include additional metal layers adjacent to the semiconductor absorber layer. One or more metal immobilizing agents can be deposited adjacent to layer(s) 110. For example, a metal immobilizing agent 120 can be deposited adjacent to layer(s) 110.

Figure 2:
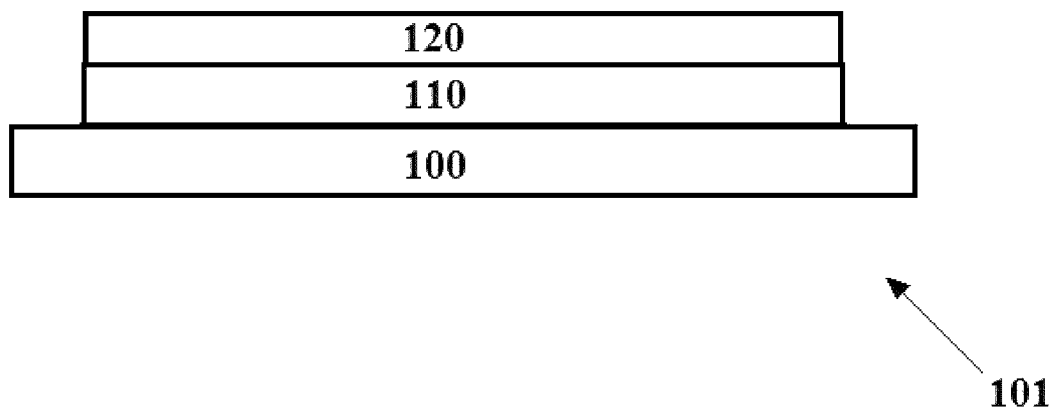
FIG. 2 is a schematic of a photovoltaic module.

Portions of semiconductor material and other coatings can be deleted from the edges of photovoltaic modules, which may comprise a series of connected photovoltaic devices. The semiconductor material can be removed from the edges by any suitable method. The area where the semiconductor material has been removed can be used to position, form, or deposit an interlayer material adjacent to the substrate. Referring to FIG. 2, portions of layer(s) 110 and layer(s) 120 have been removed from photovoltaic device 101 by mechanical means that can include laser scribing.

Figure 3:
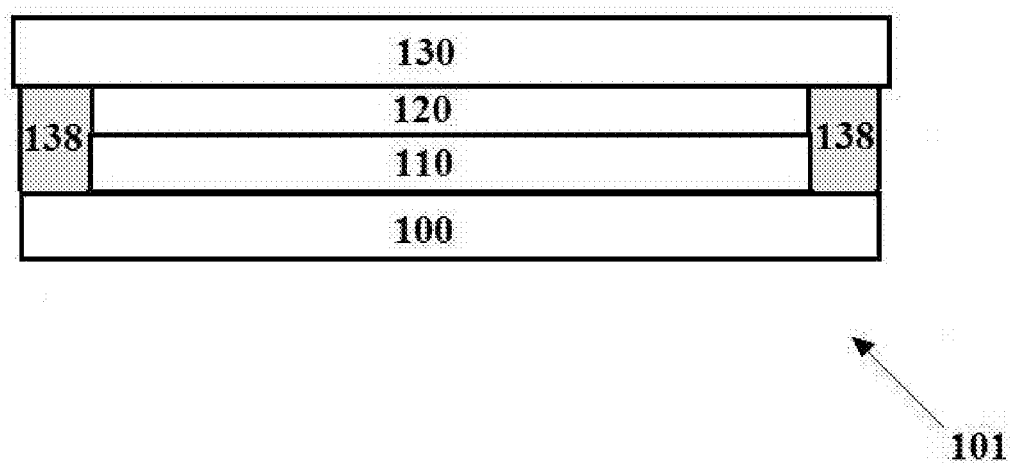
FIG. 3 is a schematic of a photovoltaic module.

Referring to FIG. 3, photovoltaic module 101 can include one or more interlayers 138, in contact with layer(s) 110 and layer(s) 120. A photovoltaic module 101 can also include a back substrate 130. Back substrate 130 can include any suitable material, including glass, for example, soda-lime glass. Back substrate 130 can be added to photovoltaic module 101 after the addition of interlayers 138. Alternatively, back substrate 130 can be added to photovoltaic module 101 before interlayers 138 are added. For example, back substrate 130 can be positioned adjacent to layer(s) 110 and layer(s) 120 to form a space proximate to the edge portions of front substrate 100 and back substrate 130. Interlayer material can be positioned in this space to form interlayer 138.

The layers of photovoltaic module 101 can be aligned, heated, and bonded together by a lamination process. Lamination encapsulates the semiconductor layers, TCO, metal conductor, and any other layers of photovoltaic module 101, sealing the photovoltaic devices from the environment. The front substrate 100 and the back substrate 130 can be bonded together with interlayers 138 through a lamination process. The interlayers can include a thermoplastic interlayer. The thermoplastic interlayer can include an acrylonitrile butadiene styrene (ABS), an acrylic (PMMA), a celluloid, a cellulose acetate, a cycloolefin copolymer (COC), a polyvinyl butyral (PVB), a silicone, an epoxy, an ethylene-vinyl acetate (EVA), an ethylene vinyl alcohol (EVOH), a fluoroplastic (PTFE), an ionomer, KYDEX®, a liquid crystal polymer (LCP), a polyacetal (POM), a polyacrylate, a polyacrylonitrile (PAN), a polyamide (PA), a polyamide-imide (PAI), a polyaryletherketone (PAEK), a polybutadiene (PBD), a polybutylene (PB), a polybutylene terephthalate (PBT), a polycaprolactone (PCL), a polychlorotrifluoroethylene (PCTFE), a polyethylene terephthalate (PET), a polycyclohexylene dimethylene terephthalate (PCT), a polycarbonate (PC), a polyhydroxyalkanoate (PHA), a polyketone (PK), a polyester, polyethylene (PE), a polyetheretherketone (PEEK), a polyetherketoneketone (PEKK), a polyetherimide (PEI), a polyethersulfone (PES), a polyethylenechlorinate (PEC), a polyimide (PI), a polylactic acid (PLA), a polymethylpentene (PMP), a polyphenylene oxide (PPO), a polyphenylene sulfide (PPS), a polyphthalamide (PPA), a polypropylene (PP), a polystyrene (PS), a polysulfone (PSU), a polytrimethylene terephthalate (PTT), a polyurethane (PU), a polyvinyl acetate (PVA), a polyvinyl chloride (PVC), a polyvinylidene chloride (PVDC), or a styrene-acrylonitrile (SAN), or any other suitable material, or any combination thereof. In certain embodiments, thermoplastic interlayer can include an ethylene vinyl acetate (EVA), a polyvinyl butyral (PVB), a silicone, or an epoxy.

Figure 4:
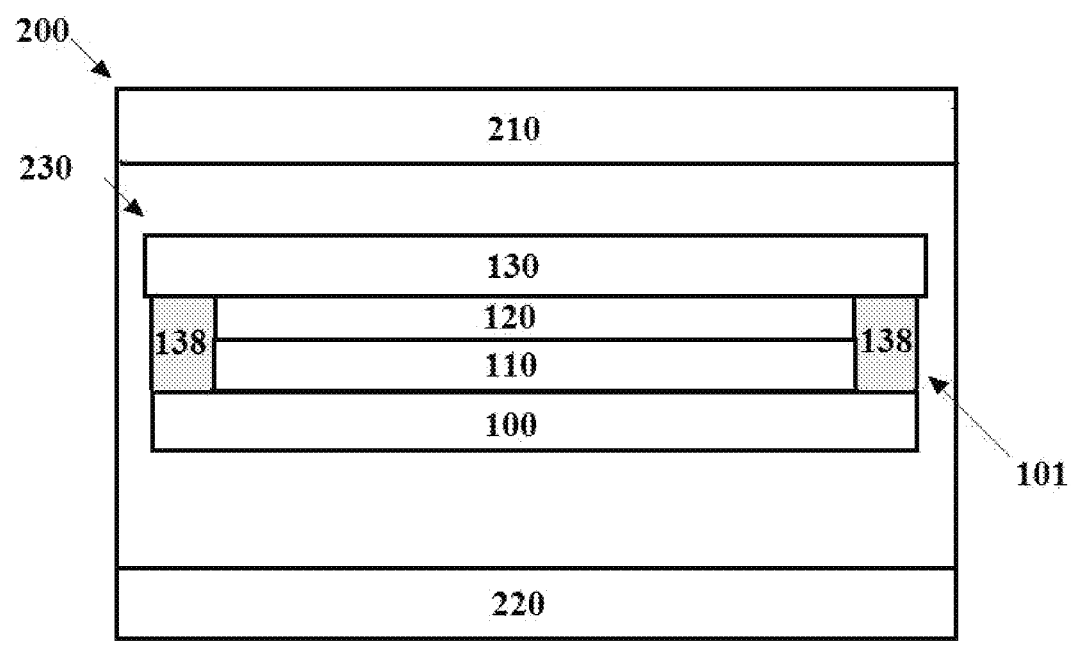
FIG. 4 is a schematic of a system for manufacturing a photovoltaic module.

Referring to FIG. 4, front substrate 100, back substrate 130 and interlayer 138 of photovoltaic module 101 can be pressed together. The means of pressing front substrate 100, back substrate 130 and interlayer 138 can include laminator 200, which can include a press. Laminator 200 can treat photovoltaic module 101 in lamination chamber 230 by heating from the bottom heating plate 220 of laminator 200 that is facing back substrate 130 while the top and bottom plates 210 and 220 of laminator 200 press front substrate 100 and back substrate 130 together. Interlayer 138 can be melted, allowed to flow and fill in gaps, and cured by this process. Lamination chamber 230 can be a vacuum chamber.

In some embodiments, photovoltaic module 101 can be heated with a source of infrared radiation (IR) in addition to treatment in laminator 200 in the lamination process. An IR heater can be used before or after interlayer 138 is added to photovoltaic device 101.

Figure 5:
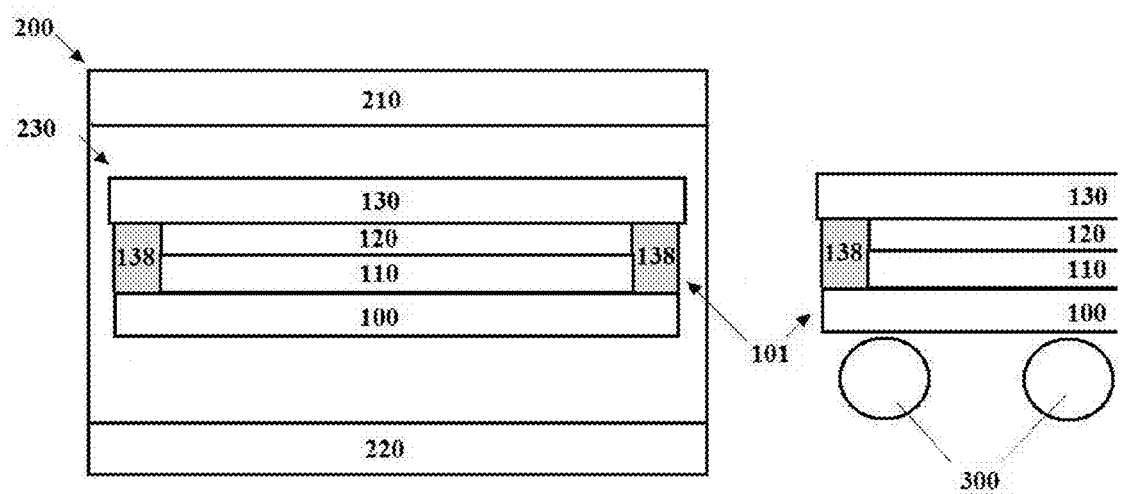
FIG. 5 is a schematic of a system for manufacturing a photovoltaic module.
Figure 6:
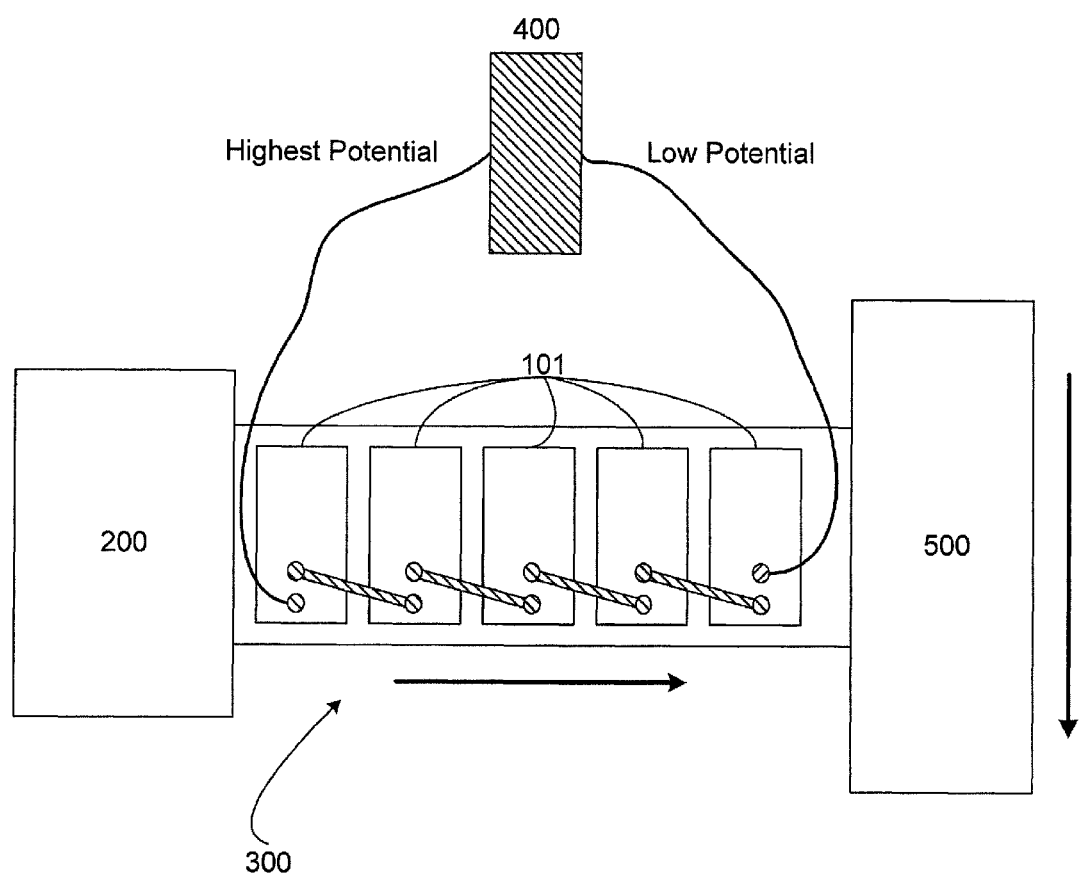
FIG. 6 is a schematic of a system for manufacturing a photovoltaic module.

Referring to FIGS. 5 and 6, a system of manufacturing a photovoltaic module can include laminator 200 to laminate photovoltaic module 101, conditioning station 300 to condition module 101 after laminator 200, and power source 400 to apply an electrical bias to photovoltaic module 101. In some embodiments, as shown in FIG. 6, power source 400 can be configured to apply an electrical bias to photovoltaic module 101 on conditioning station 300. The system of manufacturing a photovoltaic module can include conveyor 500. Conditioning station 300 can be configured to condition photovoltaic module 101 between laminator 200 and conveyor 500.

In some embodiments, the system can execute lamination and conditioning (e.g., heating and biasing of the photovoltaic module) in the same temperature cycle. Typical lamination temperature is in the range of 120-180 degree C. for a time period of 5-20 minutes. In this system, the electrical bias can be provided through an electrical power supply that is set at a constant current with an upper voltage limit or at a constant voltage with an upper current limit during the temperature cycle. The current can be in the range of 0.3-5 times the short circuit current of the photovoltaic device. The current can be in the range of 0.3-3 times the short circuit current of the photovoltaic device. In some embodiments, the system can provide lamination of the packaging and a conditioning of the photovoltaic module during a single temperature cycle through the application of an electrical bias during the temperature cycle of the lamination.

In some embodiments, the process of conditioning can occur through the application of electrical bias and heat after lamination. Indirect heat may be partially or completely provided by the lamination cycle. Typical module temperatures upon exit from lamination tool 200 can be 120-160 degree C. and the bias can be applied while the temperature is maintained or ramped down from lamination temperatures. Process times can be in the range of 1-20 minutes.

In some embodiments, the system can provide lamination of the packaging and a conditioning of the semiconductor after completion of the lamination cycle. The conditioning process can maintain cycle time of the lamination tool and the modules can remain stationary after exit from lamination tool 200 during the process. No secondary heat source is required.

Applying an electrical bias to the photovoltaic device can take place before, after, or during heating of the lamination cycle. The length of applying an electrical bias to the photovoltaic device can be longer or shorter than that of heating of the lamination cycle. Applying an electrical bias to the photovoltaic device can have the same length of time as heating of the lamination cycle.

As shown in FIG. 6, a system for manufacturing a photovoltaic module can include laminator 200, conditioning station 300, power source 400, and conveyor 500. Laminator 200 can include a heater to heat a photovoltaic module and a press to laminate a photovoltaic module, for example, by pressing a photovoltaic module interlayer together with a photovoltaic module substrate. The heated photovoltaic module can be positioned in conditioning station 300, which can provides electrical contacting and biasing. Modules can be held in conditioning station 300 after completion of the lamination cycle by laminator 200. Laminator 200 can start the lamination cycle on the next photovoltaic module 101.

During the manufacture of a photovoltaic module, electrical contact pads can be applied to photovoltaic module 101 that place the modules either in parallel or serial connection. Power source 400 can be used to operate the modules in constant current or constant voltage mode. A typical process window can be a current in the range of 0.3-5 times (for example, 0.3-3 times) the short circuit current of the photovoltaic device and a processing time of application shorter than the lamination cycle. During this time photovoltaic module 101 can be actively heated, cooled, or simply exposed to ambient to achieve a desirable temperature profile. When modules of a previous photovoltaic module batch clear conditioning station 300, the lamination cycle completes on the next photovoltaic module batch and the next batch can enter conveyor 500 located next to conditioning station 300.

As described above, conditioning of the photovoltaic modules by applying an electrical bias can occur while the photovoltaic module is being heated, or after the photovoltaic module has been heated. The conditioning can occur during the lamination process or after the lamination process. The photovoltaic module can be laminated, which can include heating the photovoltaic module. The heated photovoltaic module can then be conditioned by applying an electrical bias, after the photovoltaic module has been heated and while it is cooling. The photovoltaic device processed by the new method and system can have about a 5-20 percent efficiency increase compared to unconditioned photovoltaic modules, for example about a 15 percent improvement in efficiency. In some embodiments, the new method of manufacturing a photovoltaic device can achieve a reduction in the cost and time of production.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A method for manufacturing a photovoltaic module comprising:
   heating a photovoltaic module to a temperature above 100 degrees C.; and
   applying an electrical bias to the heated photovoltaic module,
   wherein the step of heating the photovoltaic module occurs during a lamination process further comprising:
   placing a photovoltaic module interlayer in contact with a photovoltaic module substrate before heating the photovoltaic module; and
   pressing the interlayer and the substrate together.

2. The method of claim 1, wherein applying an electrical bias to the photovoltaic module takes place during the lamination process.

3. The method of claim 1, wherein applying an electrical bias to the photovoltaic module takes place after the lamination process.

4. The method of claim 1, wherein the lamination process has a duration of 1 to 60 minutes.

5. A method for manufacturing a photovoltaic module comprising:
   heating a photovoltaic module to a temperature above 100 degrees C.; and
   applying an electrical bias to the heated photovoltaic module, wherein applying an electrical bias to the photovoltaic module takes place after heating the photovoltaic module.

6. The method of claim 5, wherein applying an electrical bias has a duration substantially the same as that of heating the photovoltaic module.

7. The method of claim 5, wherein applying the electrical bias includes supplying constant current.

8. The method of claim 5, wherein applying the electrical bias includes supplying constant voltage.

9. The method of claim 5, wherein the electrical bias generates a current that is in the range of 0.3-5 times of the short circuit current of the photovoltaic device.

10. The method of claim 5, wherein heating the photovoltaic module comprises heating the photovoltaic module to a temperature in the range of 100 to 220 degree C.

11. The method of claim 5, wherein the step of applying the electrical bias comprises applying the electrical bias for 1 to 60 minutes.

12. A method for manufacturing a photovoltaic module comprising:
heating a photovoltaic module to a temperature above 100 degrees C.; and
applying an electrical bias to the heated photovoltaic module,
wherein applying an electrical bias has a duration longer or shorter than that of heating the photovoltaic module.

13. A system for manufacturing a photovoltaic module comprising:
a conditioning station including a heater configured to heat a photovoltaic module to a temperature greater than 100 degrees C.;
a power source configured to apply an electrical bias to the photovoltaic module;
a laminator configured to press a photovoltaic module interlayer and photovoltaic module substrate together after a photovoltaic module is heated; and
a conveyor to transport a photovoltaic module from the laminator.

14. The system of claim 13, wherein the power source is configured to apply the electrical bias to a photovoltaic module subsequent to the heater heating the photovoltaic module or is configured to apply the electrical bias to a photovoltaic device simultaneous to the heater heating the photovoltaic module.

15. The system of claim 13, wherein the power source is set at a constant current or is set at a constant voltage.

16. The system of claim 13, further comprising a photovoltaic module including one or more of thin film photovoltaic device, cadmium telluride photovoltaic device, CIGS photovoltaic device, or amorphous silicon photovoltaic device.

17. The system of claim 13, wherein the interlayer comprises a thermoplastic material.

* * * * *